(12) United States Patent
Heo et al.

(10) Patent No.: US 12,089,461 B2
(45) Date of Patent: Sep. 10, 2024

(54) DISPLAY DEVICE

(71) Applicant: Samsung Display Co., LTD., Yongin-si (KR)

(72) Inventors: Mindo Heo, Gunpo-si (KR); Min Kyu Woo, Seoul (KR); Seon Young Choi, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/095,957

(22) Filed: Jan. 11, 2023

(65) Prior Publication Data
US 2023/0232679 A1    Jul. 20, 2023

(30) Foreign Application Priority Data
Jan. 17, 2022    (KR) .......................... 10-2022-0006467

(51) Int. Cl.
*H10K 59/131*    (2023.01)
*G09G 3/3233*    (2016.01)
*H10K 59/124*    (2023.01)

(52) U.S. Cl.
CPC ......... *H10K 59/131* (2023.02); *G09G 3/3233* (2013.01); *G09G 2300/0408* (2013.01); *G09G 2300/0426* (2013.01); *G09G 2300/0819* (2013.01); *G09G 2300/0852* (2013.01); *G09G 2300/0861* (2013.01); *G09G 2320/0214* (2013.01); *H10K 59/124* (2023.02)

(58) Field of Classification Search
CPC ............... H10K 59/131; H10K 59/124; H10K 59/1213; G09G 3/3233; G09G 2300/0408; G09G 2300/0426; G09G 2300/0819; G09G 2300/0852; G09G 2300/0861; G09G 2320/0214; G09G 3/32; G09G 2310/0251; G09G 3/3225; G09G 3/3291; G09G 2300/08; H01L 27/1214
See application file for complete search history.

(56) References Cited

U.S. PATENT DOCUMENTS 9,029,226 B2    5/2015    Tsai et al.
9,189,992 B2 *  11/2015   Hwang ................ G09G 3/3233
(Continued)

FOREIGN PATENT DOCUMENTS

JP    2004-095671 A    3/2004
JP    5098508          12/2012
(Continued)

*Primary Examiner* — Mihir K Rayan
(74) *Attorney, Agent, or Firm* — Lewis Roca Rothgerber Christie LLP

(57) ABSTRACT

A display device includes: a substrate; and a semiconductor layer including a driving transistor and a fourth transistor on the substrate, wherein a first electrode of the driving transistor is connected to a driving voltage line to receive a driving voltage, a first electrode of the fourth transistor is connected to a first initialization voltage line to receive a first initialization voltage, a second electrode of the fourth transistor is connected to a gate electrode of the driving transistor, a low doping region is between a channel of the fourth transistor and the first electrode of the fourth transistor, and a low doping region is not between the channel of the further transistor and the second electrode of the fourth transistor.

20 Claims, 19 Drawing Sheets

(56) References Cited

U.S. PATENT DOCUMENTS

| | | | |
|---|---|---|---|
| 2005/0074914 A1* | 4/2005 | Chang | H01L 29/78621 |
| | | | 257/E29.279 |
| 2010/0327354 A1* | 12/2010 | Jang | H01L 29/78621 |
| | | | 257/E21.415 |
| 2012/0069259 A1* | 3/2012 | Oh | H01L 27/1214 |
| | | | 438/34 |
| 2014/0117340 A1* | 5/2014 | Kim | H01L 27/1255 |
| | | | 438/34 |
| 2019/0109240 A1* | 4/2019 | Yu | H01L 21/02592 |
| 2021/0066429 A1* | 3/2021 | Kim | G09G 3/3266 |

FOREIGN PATENT DOCUMENTS

| | | |
|---|---|---|
| KR | 10-1186292 | 9/2012 |
| KR | 10-2014-0062862 A | 5/2014 |

\* cited by examiner

DISPLAY DEVICE

CROSS-REFERENCE TO RELATED APPLICATION

This application claims priority to and the benefit of Korean Patent Application No. 10-2022-0006467 filed in the Korean Intellectual Property Office on Jan. 17, 2022, the entire content of which is incorporated by reference herein.

BACKGROUND

1. Field

Embodiments of the present disclosure relate to a display device, and more specifically, to a display device with reduced leakage current.

2. Description of the Related Art

A display device is a device that displays an image, and recently, organic light emitting diode displays, which are a type of emissive display device, have been attracting attention.

Emissive display devices have a self-emissive characteristic, and unlike liquid crystal displays (LCDs), they do not require a separate light source, so their thickness and weight may be reduced. In addition, emissive display devices exhibit high quality characteristics such as low power consumption, high luminance, and high reaction speed.

In general, an emissive display device includes a substrate, a plurality of thin film transistors positioned on the substrate, a plurality of insulating layers disposed between wires constituting the thin film transistors, and an organic light emitting element connected to the thin film transistors.

The emissive display device includes a plurality of pixels, and each pixel includes a plurality of transistors.

The above information disclosed in this Background section is only for enhancement of understanding of the background of the present disclosure, and therefore it may contain information that does not form the prior art that is already known to a person of ordinary skill in the art.

SUMMARY

Embodiments of the present disclosure provide a display device with reduced leakage current.

A display device according to one or more embodiments of the present disclosure includes: a substrate; and a semiconductor layer including a driving transistor and a fourth transistor on the substrate, a first electrode of the driving transistor connected to a driving voltage line to receive a driving voltage, a first electrode of the fourth transistor connected to a first initialization voltage line to receive a first initialization voltage, a second electrode of the fourth transistor connected to a gate electrode of the driving transistor, a low doping region between the channel of the fourth transistor and the first electrode of the fourth transistor, and wherein a low doping region is not between the channel of the fourth transistor and the second electrode of the fourth transistor.

In one or more embodiments, the semiconductor layer may further include a second transistor, and a first electrode of the second transistor may be connected to a data line to receive a data voltage, a second electrode of the second transistor may be connected to the gate electrode of the driving transistor, a low doping region may be between a channel of the second transistor and the first electrode of the second transistor, and a low doping region may be between the channel of the second transistor and the second electrode of the second transistor.

In one or more embodiments, the semiconductor layer may further include a third transistor, and a first electrode of the third transistor may be connected to a second electrode of the driving transistor, a second electrode of the third transistor may be connected to the gate electrode of the driving transistor, a low doping region may be between a channel of the third transistor and the first electrode of the third transistor, and a low doping region may be between the channel of the third transistor and the second electrode of the third transistor.

In one or more embodiments, the semiconductor layer may further include a fifth transistor, and a first electrode of the fifth transistor may be connected to the driving voltage line to receive the driving voltage, a second electrode of the fifth transistor may be connected to the gate electrode of the driving transistor, a low doping region may be between the channel of the fifth transistor and the first electrode of the fifth transistor, and a low doping region may be between the channel of the fifth transistor and the second electrode of the fifth transistor.

In one or more embodiments, the semiconductor layer may further include a sixth transistor, and a first electrode of the sixth transistor may be connected to a second electrode of the driving transistor, and a second electrode of the sixth transistor may be connected to a light emitting diode (LED).

In one or more embodiments, the semiconductor layer may further include a seventh transistor, and a first electrode of the seventh transistor may be connected to a second initialization voltage line to receives a second initialization voltage, and a second electrode of the seventh transistor may be connected to a light emitting diode (LED).

In one or more embodiments, a plurality of doping patterns on the semiconductor layer may be further included, and the plurality of doping patterns may overlap the low doping region in a direction perpendicular to the substrate.

In one or more embodiments, a hold capacitor between the second electrode of the fifth transistor and the driving voltage line may be further included.

In one or more embodiments, a storage capacitor between the second electrode of the second transistor and the gate electrode of the driving transistor may be further included.

A display device according to one or more embodiments of the present disclosure includes: a substrate; a semiconductor layer on the substrate and including a driving transistor, a second transistor, a third transistor, a fourth transistor, a fifth transistor, a sixth transistor, and a seventh transistor; a gate conductive layer on the semiconductor layer; and a plurality of doping patterns on the gate conductive layer, wherein the plurality of doping patterns overlap the second transistor, the third transistor, the fourth transistor, and the fifth transistor, respectively, and wherein one edge of a doping pattern of the plurality of doping patterns that overlaps the fourth transistor is on the gate conductive layer overlapping the fourth transistor.

In one or more embodiments, a channel of the fourth transistor may overlap the gate conductive layer, a first side region adjacent to the channel may overlap the doping pattern, and a second side region adjacent to the channel may not overlap the doping pattern.

In one or more embodiments, a doping concentration of the first side region overlapping the doping pattern may be lower than a doping concentration of the second side region that does not overlap the doping pattern.

In one or more embodiments, the fourth transistor may include: a channel; a first electrode on one side of the channel and a second electrode on another side of the channel; and a low doping region between the first electrode and the channel, and wherein the low doping region may have a doping concentration that is lower than that of the first electrode and the second electrode.

In one or more embodiments, the low doping region may overlap the doping pattern.

In one or more embodiments, the first electrode of the driving transistor may be connected to a driving voltage line to receive a driving voltage, the first electrode of the fourth transistor may be connected to a first initialization voltage line to receive a first initialization voltage, and the second electrode of the fourth transistor may be connected to the gate electrode of the driving transistor.

In one or more embodiments, a channel of the second transistor may overlap the gate conductive layer, and both regions of the second transistor adjacent to the channel may overlap the plurality of doping patterns.

In one or more embodiments, a channel of the third transistor may overlap the gate conductive layer, and both regions of the third transistor adjacent to the channel may overlap the plurality of doping patterns.

In one or more embodiments, a channel of the fifth transistor may overlap the gate conductive layer, and both regions of the fifth transistor adjacent to the channel may overlap the plurality of doping patterns.

In one or more embodiments, the second transistor, the third transistor, and the fifth transistor may each respectively include: a channel overlapping the gate conductive layer; a first electrode on one side of the channel and a second electrode positioned on another side of the channel; and a low doping region between the channel and the first electrode, and between the channel and the second electrode.

In one or more embodiments, the low doping region may overlap the plurality of doping patterns.

According to one or more embodiments of the present disclosure, a display device with reduced leakage current may be provided.

DETAILED DESCRIPTION

Figure 1:
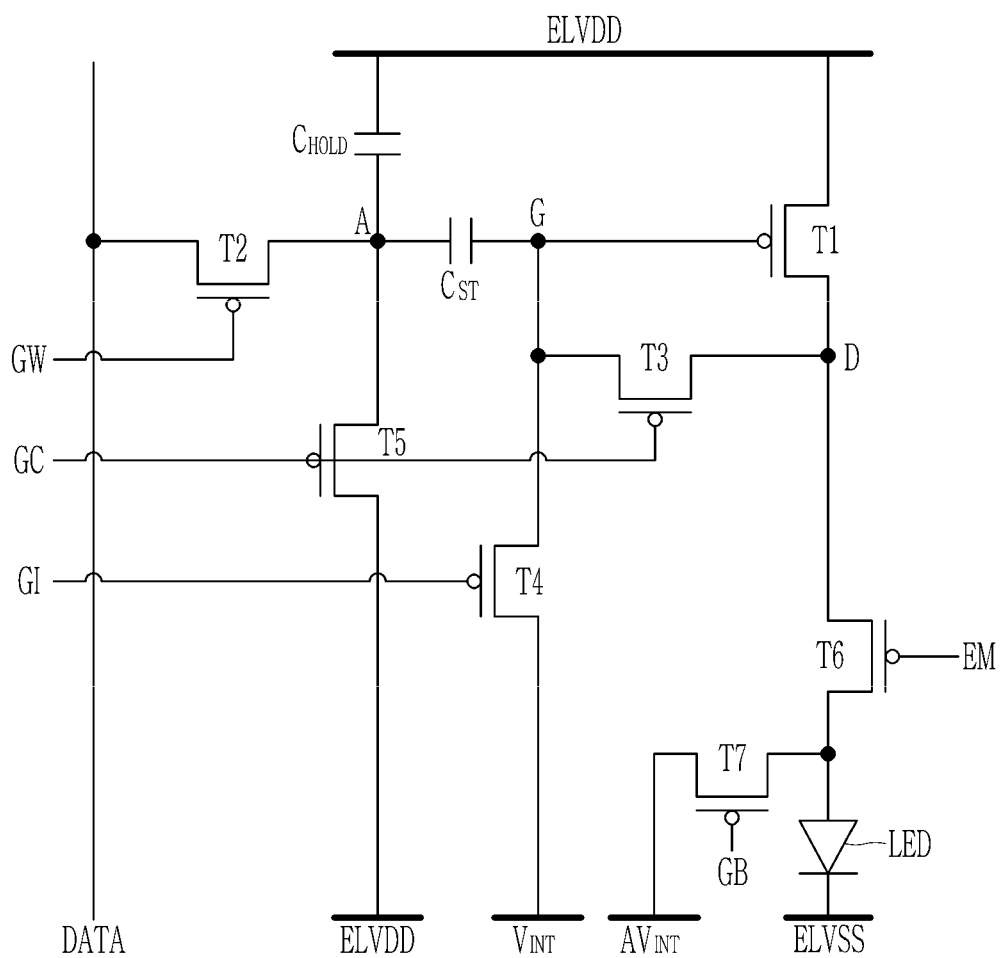
FIG. 1 is an equivalent circuit diagram of one pixel included in an emissive display device according to one or more embodiments of the present disclosure.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure. Accordingly, processes, elements, and techniques that are not necessary to those having ordinary skill in the art for a complete understanding of the aspects and features of the present invention may not be described. Like reference numerals designate like elements throughout the specification.

Further, because sizes and thicknesses of constituent members shown in the accompanying drawings may be exaggerated for better understanding and ease of description, the present disclosure is not limited to the illustrated sizes and thicknesses. In the drawings, the thickness of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In addition, unless explicitly described to the contrary, the word "comprise", and variations such as "comprises" or "comprising", and "include", and variations such as "includes" or "including" will be understood to imply the inclusion of stated elements but not the exclusion of any other elements.

Further, in the specification, the phrase "on a plane" means viewing the object portion from the top, and the phrase "on a cross-section" means viewing a cross-section of which the object portion is vertically cut from the side.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

As used herein, the singular forms "a" and "an" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Now, a display device according to one or more embodiments is described with reference to accompanying drawings.

FIG. 1 is an equivalent circuit diagram of one pixel included in an emissive display device according to one or more embodiments of the present disclosure.

Referring to FIG. 1, one pixel includes a light emitting diode (LED) LED and a pixel circuit that drives the same, and the pixel circuit is arranged in a matrix form. The pixel circuit unit includes all other elements except for the light emitting diode LED in FIG. 1, and the pixel circuit unit of the pixel according to the embodiment(s) of FIG. 1 includes a driving transistor T1, a second transistor T2, a third transistor T3, a fourth transistor T4, a fifth transistor T5, a sixth transistor T6, a seventh transistor T7, a storage capacitor Cst, and a hold capacitor Chold. In addition, a first scan line to which a first scan signal GW is applied, a second scan line to which a second scan signal GC is applied, a third scan line to which a third scan signal GI is applied, a light emission signal line to which a light emission control signal EM is applied, and a data line to which a data voltage DATA is applied may be connected to the pixel circuit unit. In addition, the pixel may receive a driving voltage ELVDD, a driving low voltage ELVSS, a first initialization voltage Vint, and a second initialization voltage AVint.

The structure of the pixel while focusing on each element (the transistor, the capacitor, and the light emitting diode LED included in the pixel, is described as follows.

The driving transistor T1 includes a gate electrode connected to a first electrode of the storage capacitor Cst, a first electrode (an input side electrode) connected to the driving voltage ELVDD, and a second electrode (an output side electrode) that outputs a current according to the voltage of the gate electrode.

The gate electrode of the driving transistor T1 is connected to a second electrode (an output side electrode) of the third transistor T3 and a second electrode (an output side electrode) of the fourth transistor T4 at a node G. The second electrode of the driving transistor T1 is connected to a first electrode (an input side electrode) of the third transistor T3 and a first electrode (an input side electrode) of the sixth transistor T6 at a node D. The output current of the driving transistor T1 passes through the sixth transistor T6 and is transmitted to the light emitting diode LED so that the light emitting diode LED emits light. The luminance of the light emitted by the light emitting diode LED is determined according to the magnitude of the output current of the driving transistor T1.

The second transistor T2 includes the gate electrode connected to the first scan line to which the first scan signal GW is applied, the first electrode (an input side electrode) connected to the data line to which the data voltage DATA is applied, and the second electrode (an output side electrode) connected to the second electrode of the storage capacitor Cst. The second transistor T2 allows the data voltage DATA to enter the pixel according to the first scan signal GW and be stored in the storage capacitor Cst. The second electrode of the second transistor T2 is also connected to the second electrode (an output side electrode) of the fifth transistor T5 at the node A.

The storage capacitor Cst includes the first electrode connected to the gate electrode of the driving transistor T1 and the second electrode connected to the second electrode of the second transistor T2, the second electrode of the fifth transistor T5, and the first electrode of the hold capacitor Chold. The storage capacitor Cst receives the data voltage DATA output from the second transistor T2 and maintains it as the voltage at the gate electrode of the driving transistor T1. In the pixel of the present embodiment, the data voltage DATA is not directly transmitted to the gate electrode of the driving transistor T1, but it is transmitted through the storage capacitor Cst. This is a method of indirectly transferring the data voltage DATA to the gate electrode of the driving transistor T1 by taking advantage of the fact that when the voltage of the second electrode of the storage capacitor Cst suddenly rises, the voltage of the first electrode, which is the other electrode, also rises. According to this method, even if leakage occurs in the second transistor T2, the voltage of the gate electrode of the driving transistor T1 does not directly leak. Also, in the present embodiment, the data voltage DATA passes through the storage capacitor Cst without passing through the other electrode of the driving transistor T1 and is directly transferred to the gate electrode of the driving transistor T1, and even if there is a difference in the driving voltage ELVDD depending on the position of the pixel, there is also merit in that the voltage stored in the storage capacitor Cst is determined without affecting the difference of the driving voltage ELVDD.

The hold capacitor Chold includes the first electrode connected to the second electrode of the storage capacitor Cst and the second electrode to which the driving voltage ELVDD is applied. The first electrode of the hold capacitor Chold is additionally connected to the second electrode of the second transistor T2 and the second electrode of the fifth transistor T5 at the node A.

According to the hold capacitor Chold, even when the surrounding signal changes, the voltage of the second electrode of the storage capacitor Cst is held without being changed so as to have a constant voltage.

The third transistor T3 includes the gate electrode connected to the second scan line to which the second scan signal GC is applied, the first electrode (an input side electrode) connected to the second electrode of the driving transistor T1, and the second electrode (an output side electrode) connected to the first electrode of the storage capacitor Cst. The third transistor T3 forms a compensation path for compensating the threshold voltage of the driving transistor T1 so that the threshold voltage of the driving transistor T1 is transmitted to the first electrode of the storage capacitor Cst to be compensated. As a result, even if the threshold voltage of the driving transistor T1 included in each pixel is different, the driving transistor T1 may output a constant output current according to the applied data voltage DATA. The second electrode of the third transistor T3 is also connected to the second electrode of the fourth transistor T4.

The fourth transistor T4 includes the gate electrode connected to the third scan line to which the third scan signal GI is applied, the first electrode to which the first initialization voltage Vint is applied, and the second electrode connected to the first electrode of the storage capacitor Cst (and/or the gate electrode of the driving transistor T1 and/or the second electrode of the third transistor T3). The fourth transistor T4 initializes the first electrode of the storage capacitor Cst and the gate electrode of the driving transistor T1 to the first initialization voltage Vint.

The fifth transistor T5 includes the gate electrode connected to the second scan line to which the second scan signal GC is applied, the first electrode to which the driving voltage ELVDD is applied, and the second electrode connected to the second electrode of the storage capacitor Cst, the first electrode of the hold capacitor Chold, and the second electrode of the second transistor T2 at the node A.

The sixth transistor T6 includes the gate electrode connected to the light emission signal line to which the light emission control signal EM is applied, the first electrode (an input side electrode) connected to the second electrode of the driving transistor T1, and the second electrode (an output side electrode) connected to the anode of the light emitting diode LED. Here, the first electrode of the sixth transistor T6 is also connected to the first electrode of the third transistor T3, and the second electrode of the sixth transistor T6 is also connected to the second electrode of the seventh transistor T7. The sixth transistor T6 serves to transmit or block the output current of the driving transistor T1 to the light emitting diode LED based on the light emission control signal EM.

The seventh transistor T7 includes the gate electrode connected to a fourth scan line to which a fourth scan signal GB is applied, a first electrode to which a second initialization voltage AVint is applied, and a second electrode connected to an anode of a light emitting diode LED. The second electrode of the seventh transistor T7 is also connected to the second electrode of the sixth transistor T6. The seventh transistor T7 serves to initialize the anode of the light emitting diode LED with the second initialization voltage AVint.

In the embodiment(s) of FIG. 1, all transistors may be formed using a polycrystalline semiconductor, and may be doped with doping particles of the same type. However, the present disclosure is not limited thereto, and the transistor may include an amorphous semiconductor. According to one or more embodiments, it is also possible for some transistors to include a polycrystalline semiconductor and for some transistors to include an amorphous semiconductor. In the embodiment(s) of FIG. 1, all transistors are doped with the P-type, but the present disclosure is not limited thereto.

The light emitting diode LED includes the anode connected to the second electrode of the sixth transistor T6 and the cathode connected to the driving low voltage ELVSS. The light emitting diode LED may be connected between the pixel circuit unit and the driving low voltage ELVSS to emit light with a luminance corresponding to the current supplied from the pixel circuit unit (e.g., the driving transistor T1). The light emitting diode LED may include an emission layer including at least one of an organic light emission material and/or an inorganic light emission material. Holes and electrons are injected into the emission layer from the anode and the cathode, respectively, and light is emitted when excitons of which the injected holes and electrons are combined fall from an excited state to a ground state. The light emitting diode LED may emit light of one of primary colors or white light. Examples of primary colors include three primary colors of red, green, and blue. Other examples of primary colors include yellow, cyan, and magenta. According to one or more embodiments, it is possible to improve the display characteristic of the color by further including an additional color filter or color conversion layer.

In a display device having such a circuit diagram, a leakage current Ioff may occur due to various causes during the circuit's operation. Due to this leakage current Ioff, a flicker phenomenon may occur in the display device. The leakage current Ioff refers to a phenomenon in which the current flows even when the transistor is not in operation or flows to a place other than where it should flow.

Figure 2:
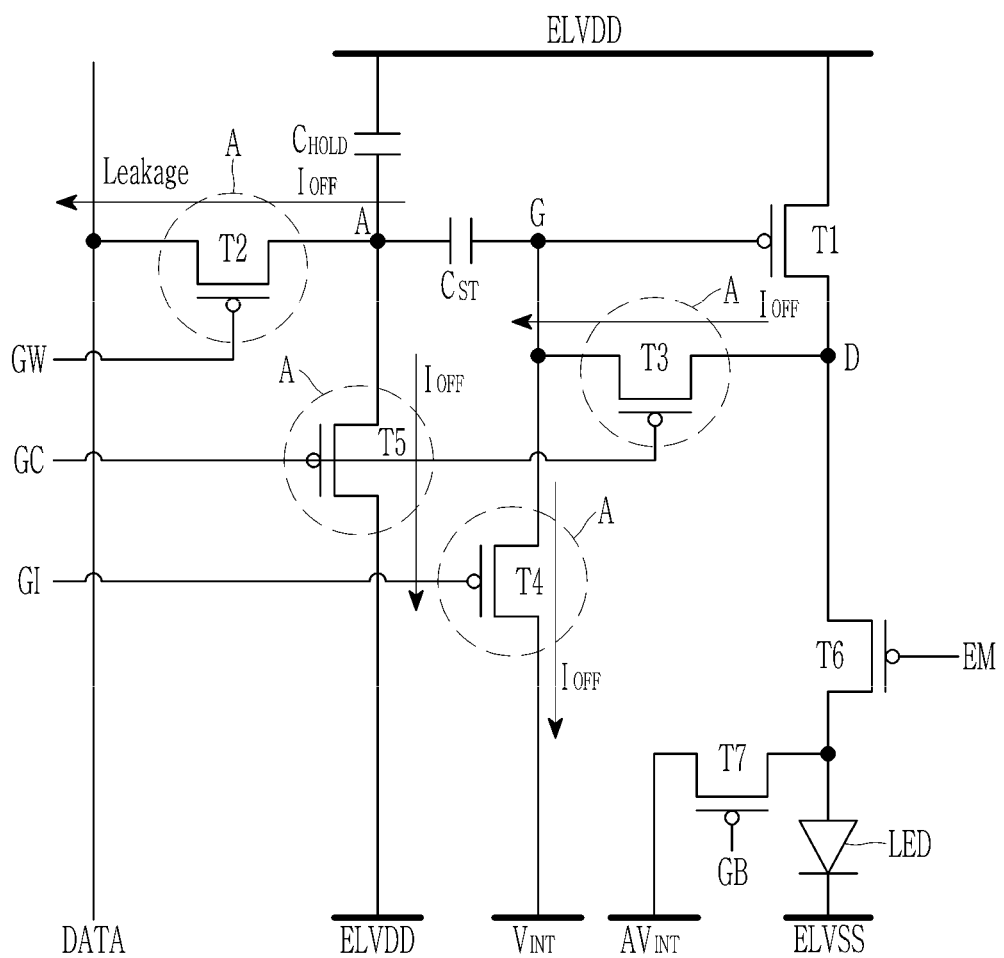
FIG. 2 is a circuit diagram showing a flow of leakage current (Ioff) in a circuit.

FIG. 2 is a circuit diagram showing a flow of leakage current Ioff in a circuit. As shown in FIG. 2, the leakage current may flow through the second transistor T2, the third transistor T3, the fourth transistor T4, and/or the fifth transistor T5. In FIG. 2, the transistors through which the leakage current flows are shown as a dotted line A.

Accordingly, in order to prevent the flicker from occurring due to the flow of the leakage current, a low doping region LDA may be formed in the electrodes of the second transistor T2, the third transistor T3, the fourth transistor T4, and the fifth transistor T5 through which the leakage current passes. Although it will be described in more detail later, the low doping region LDA means a region of the semiconductor layer that is less doped than other regions. In this low doping region LDA, the dopant content is smaller than that of the sufficiently doped region, so the current may flow less and function like a resistor. Therefore, by forming the low doping region LDA in the transistor in this way, the flow of the leakage current in the circuit may be suppressed and the flicker phenomenon may be reduced.

The transistors marked by A in FIG. 2 are the transistors through which the leakage current flows. Accordingly, in one or more embodiments, the low doping region is formed in the second transistor T2, the third transistor T3, the fourth transistor T4, and the fifth transistor T5.

However, when forming the low doping region in each of the second transistor T2, the third transistor T3, the fourth transistor T4, and the fifth transistor T5 in this way, as the doping pattern to form the low doping region is added in the pixel, design restrictions may occur. Therefore, it may be difficult to reduce the pixel size to a certain size or less by the doping pattern, and it may not be easy to implement high resolution.

However, in the case of the display device according to one or more embodiments of the present disclosure, the low doping region is applied to the second transistor T2, the third transistor T3, and the fifth transistor T5 to (or at) both sides of the channel region, and the low doping region is applied to one side of the fourth transistor T4, thereby the area of the doping pattern is reduced. Therefore, compared to the structure in which each of the second transistor T2, the third transistor T3, the fourth transistor T4, and the fifth transistor T5 are doped on both sides, design freedom may be increased and the pixel size may be reduced. Therefore, it is easy to implement high resolution.

Figure 3:
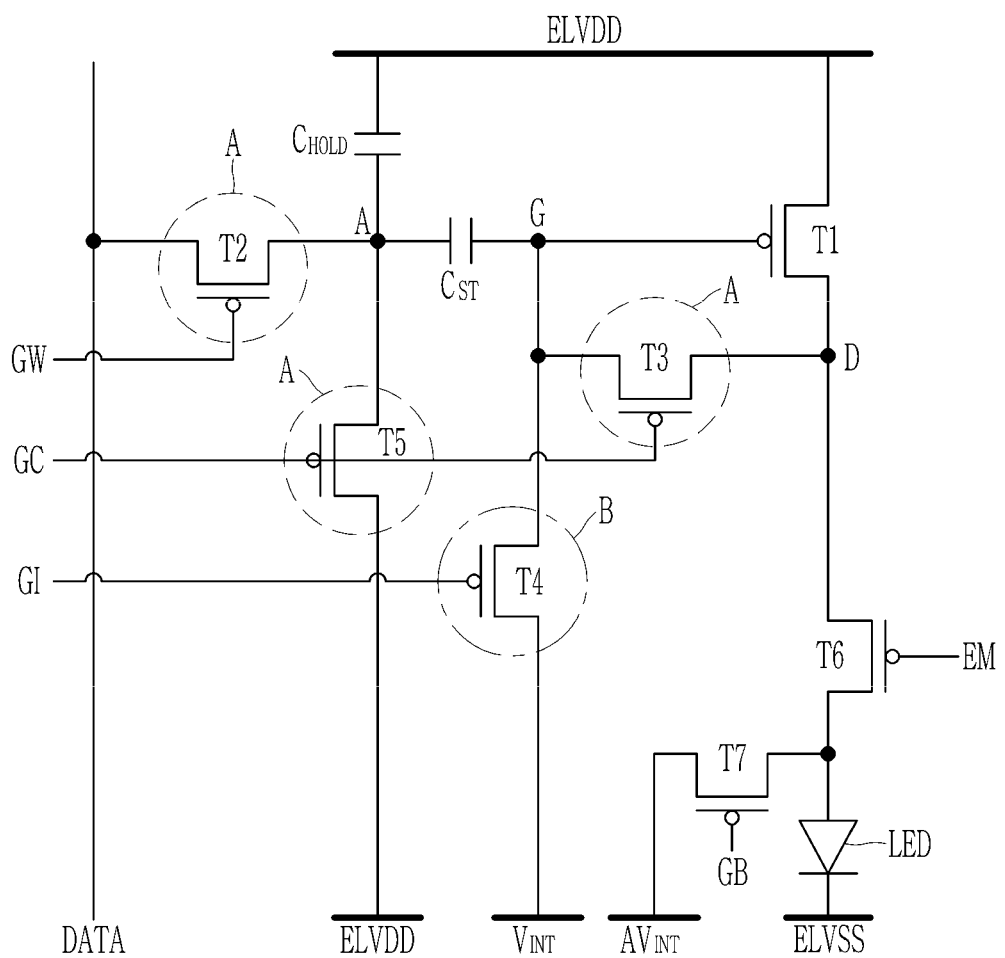
FIG. 3 is a circuit diagram according to one or more embodiments of the present disclosure.

FIG. 3 is a circuit diagram according to one or more embodiments of the present disclosure. In FIG. 3, transistors in which the low doping region is formed on (or at) both sides are classified as A, and transistors in which the low doping region is formed only on one side are classified as B. As shown in FIG. 3, in the display device according to one or more embodiments of the present disclosure, the low doping region is formed on (or at) both sides of the channel region in the second transistor T2, the third transistor T3, and the fifth transistor T5, and the low doping region is formed only on one side in the fourth transistor T4.

Hereinafter, the low doping region of the present disclosure is described in detail.

In order to reduce the leakage current, it is desirable to form the low doping region in the drain electrode of each transistor. In the case of the second transistor T2, the third transistor T3, and the fifth transistor T5, the source electrode and the drain electrode are changed according to the displayed image or gray. Therefore, in the second transistor T2, the third transistor T3, and the fifth transistor T5, the low doping regions should be positioned on both sides of the transistor. However, in the case of the fourth transistor T4, the source electrode and the drain electrode are the same even if the displayed image or gray is different. Therefore, even if the low doping region is formed on (or at) only one side, the leakage current may be effectively reduced. That is, even if the low doping region is formed only in the drain electrode of the fourth transistor T4, the leakage current may be effectively reduced.

Table 1 below shows the source electrode and the drain electrode of each transistor according to the displayed image.

TABLE 1

| TFT | Pattern | Source | Drain |
|---|---|---|---|
| Second transistor T2 |  | DATA | A |
|  |  | A | DATA |
| Third transistor T3 | Low gray | G | D |
|  | High gray | D | G |
| Fourth transistor T4 | All pattern | G | Vint |
| Fifth transistor T5 | Low gray | A | ELVDD |
|  | High gray | ELVDD | A |

Referring to Table 1, in the case of the second transistor T2, the third transistor T3, and the fifth transistor T5, the source electrode and the drain electrode are changed according to the displayed image or gray. That is, in the second transistor, the electrode connected to the data line becomes the source in a low gray, and the electrode connected to a node A of FIG. 3 becomes the drain electrode, but it is the opposite in a high gray. Similarly, in the third transistor, the electrode connected to the node G of FIG. 3 becomes the source electrode in a low gray, and the electrode connected to the node D of FIG. 3 becomes the drain electrode, but it is the opposite in a high gray. In the fifth transistor, the electrode connected to the node A of FIG. 3 becomes the source electrode and the electrode connected to the driving voltage line becomes the drain electrode in a low gray, but in a high gray it is the opposite. As such, in the case of the second transistor T2, the third transistor T3, and the fifth transistor T5, the source electrode and the drain electrode are changed according to the displayed image or gray, and the current flow changes, so the low doping region must be formed in both electrodes of the transistor. However, again referring to Table 1, in the case of the fourth transistor T4, the node G of FIG. 3 is the source electrode, and the initialization voltage line supplying the initialization voltage Vint is the drain electrode. Therefore, even if the low doping region is formed only in the drain electrode through which the leakage current flows, the flow of the leakage current may be effectively prevented (or substantially prevented).

Figure 4:
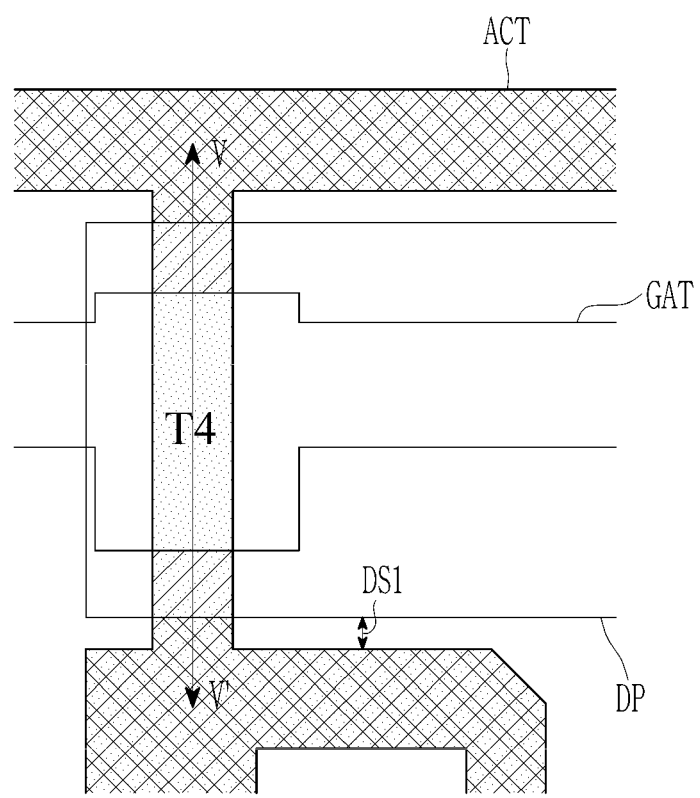
FIG. 4 is a layout view showing a configuration in which low doping regions are formed on both sides of a fourth transistor, according to one or more embodiments of the present disclosure.
Figure 5:
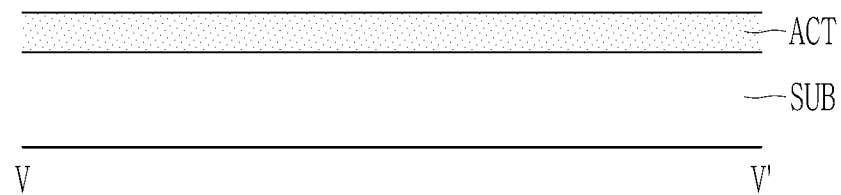
FIG. 5 to FIG. 7 are cross-sectional views showing steps of a doping process taken along the line V-V' of FIG. 4, according to one or more embodiments of the present disclosure.
Figure 6:
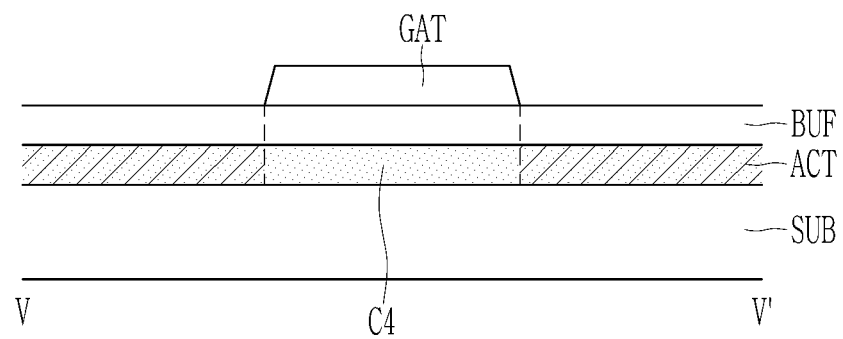
Figure 7:
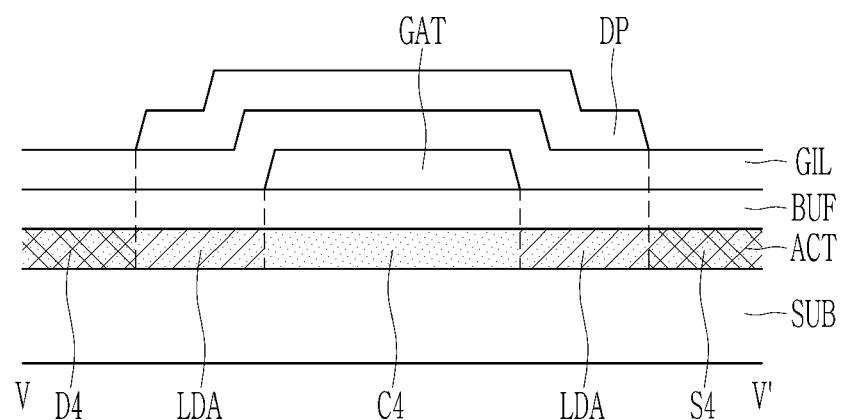

FIG. 4 is a layout view showing a configuration in which low doping regions are formed on (or at) both sides of a fourth transistor T4, according to one or more embodiments of the present disclosure. FIG. 5 to FIG. 7 are cross-sectional views showing steps of a doping process, taken along the line V-V' of FIG. 4, according to one or more embodiments of the present disclosure.

Referring to FIG. 5, a semiconductor layer ACT is positioned on a substrate SUB. Next, referring to FIG. 6, a buffer layer BUF and a gate conductive layer GAT are formed on (or at) the semiconductor layer ACT. At this time, the region of the semiconductor layer ACT overlapping the gate conductive layer GAT becomes a channel C4.

Referring to FIG. 6, the semiconductor layer ACT is doped by using the gate conductive layer GAT as a mask. In this process, the semiconductor layer ACT that does not overlap with the gate conductive layer GAT is doped first.

Next, referring to FIG. 7, a gate insulating layer GIL and a doping pattern DP are formed on (or at) the gate conductive layer GAT. Secondarily, the semiconductor layer ACT is doped using the doping pattern DP as a mask. At this time, the semiconductor layer ACT covered by the doping pattern DP is not doped secondarily.

Accordingly, as shown in FIG. 7, the semiconductor layer ACT includes a channel C4, a low doping region LDA positioned on both sides of the channel C4, and a first electrode D4 and a second electrode S4 positioned on both sides of the low doping region LDA.

So, in the case of the display device of FIG. 4 to FIG. 7, the low doping region LDA is positioned on both sides of the fourth transistor T4. The low doping region LDA is positioned overlapping the doping pattern DP. Referring to FIG. 4 and FIG. 7, the doping pattern DP is positioned on both sides of the channel C4. Therefore, a space for forming the doping pattern DP must be secured, which may make it difficult to reduce the size of the pixel.

Figure 8:
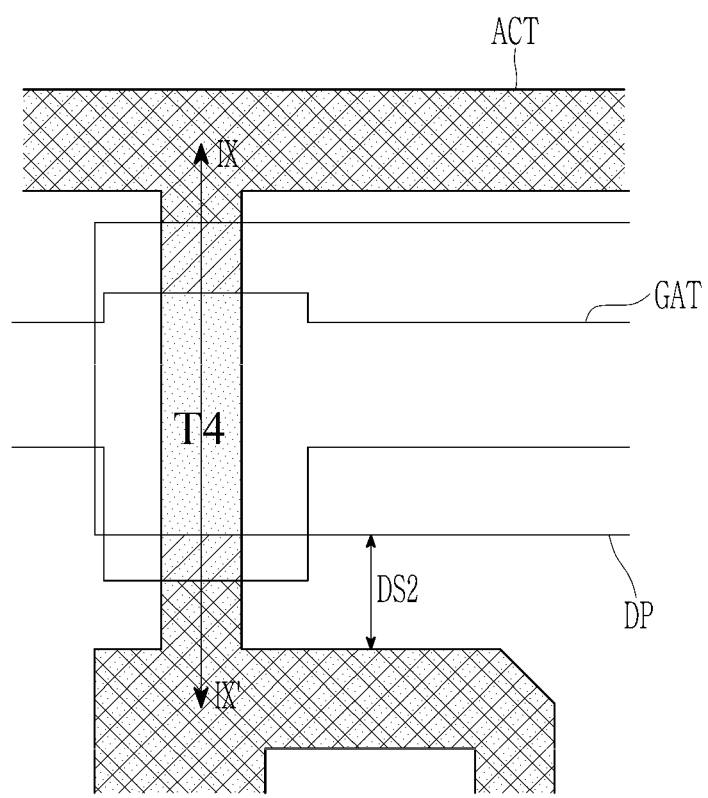
FIG. 8 is a layout view showing a fourth transistor according to one of more embodiments of the present disclosure.
Figure 9:
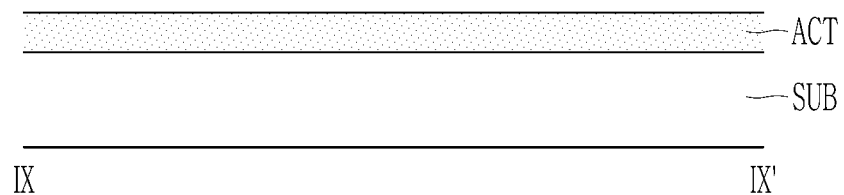
FIG. 9 to FIG. 11 are cross-sectional views showing steps of a doping process taken along the line IX-IX' of FIG. 8, according to one or more embodiments of the present disclosure.
Figure 10:
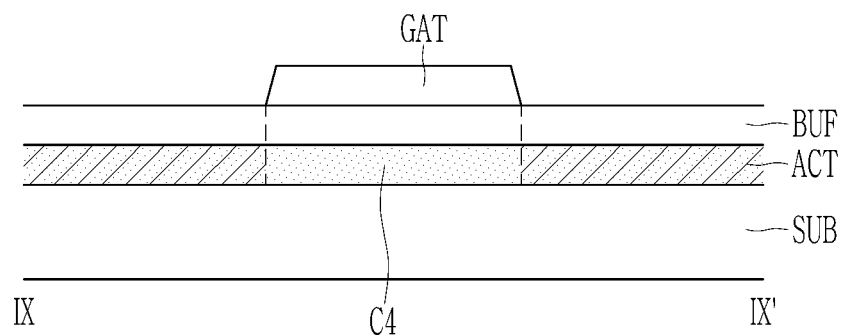
Figure 11:
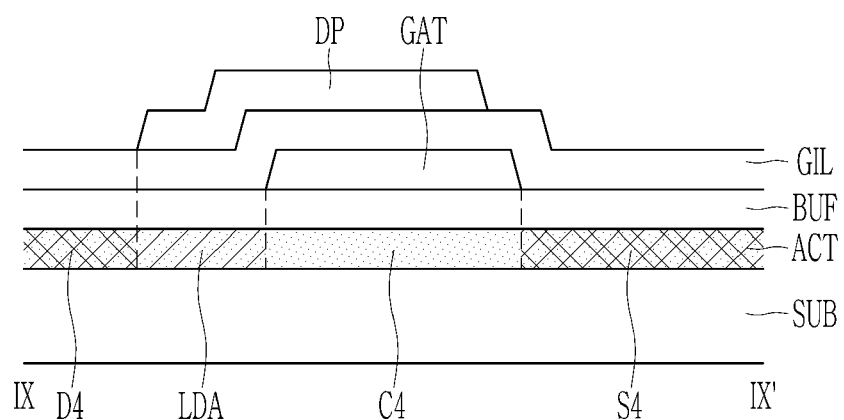

FIG. 8 is a layout view showing a fourth transistor T4 according to one or more embodiments of the present disclosure. Referring to FIG. 8, in the fourth transistor T4 according to the present embodiment(s), the low doping region is only formed on (or at) one side. FIG. 9 to FIG. 11 are cross-sectional views showing steps of a doping process, taken along the line IX-IX' of FIG. 8, according to one or more embodiments.

Referring to FIG. 9, first, the semiconductor layer ACT is positioned on the substrate SUB. Next, referring to FIG. 10, a buffer layer BUF and a gate conductive layer GAT are formed on (or at) the semiconductor layer ACT. At this time, the region of the semiconductor layer ACT overlapping the gate conductive layer GAT becomes the channel C4.

Referring to FIG. 10, the semiconductor layer ACT is doped using the gate conductive layer GAT as a mask. In this process, the semiconductor layer ACT that does not overlap with the gate conductive layer GAT is doped first.

Next, referring to FIG. 11, a gate insulating layer GIL and a doping pattern DP are formed on (or at) the gate conductive layer GAT. At this time, the doping pattern DP is formed to cover only one region of the semiconductor layer ACT based on the channel C4.

Next, the semiconductor layer ACT is secondarily doped using the doping pattern DP as a mask. At this time, the semiconductor layer ACT covered by the doping pattern DP is not doped secondarily.

Accordingly, as shown in FIG. 11, the semiconductor layer ACT includes the channel C4, the low doping region LDA positioned on one side of the channel C4, and the first electrode D4 and the second electrode S4.

At this time, the low doping region LDA is positioned between the channel C4 and the first electrode D4, and is not positioned between the channel C4 and the second electrode S4. Referring to FIG. 3, the first electrode D4 of the fourth transistor T4 is connected to the initialization voltage line to receive the initialization voltage Vint.

When comparing FIG. 8 in which the low doping region is formed on (or at) one side of the fourth transistor T4 with FIG. 4 in which the low doping region is formed on (or at) both sides of the fourth transistor T4, in the case of FIG. 4, the distance DS1 between the doping pattern DP and the semiconductor layer ACT was narrow, but in the case of FIG. 8, the distance DS2 between the doping pattern DP and the semiconductor layer ACT is longer than the distance DS1 of FIG. 4. That is, in the case of FIG. 8, as the size of the doping pattern DP is reduced, a free space is secured within the pixel, and the pixel size may be formed smaller as a result of the free space, which is advantageous for high resolution.

Hereinafter, the arrangement of the pixel according to one or more embodiments of the present disclosure is described with reference to FIG. 12 to FIG. 19. FIG. 12 to FIG. 18 are layout views showing steps for stacking a stacked structure of a pixel according to one or more embodiments of the present disclosure. FIG. 19 is a cross-sectional view taken along the line IXX-IXX' of FIG. 18 according to one or more embodiments of the present disclosure.

However, the structure described below is only an example, and the present disclosure is not limited thereto.

Figure 12:
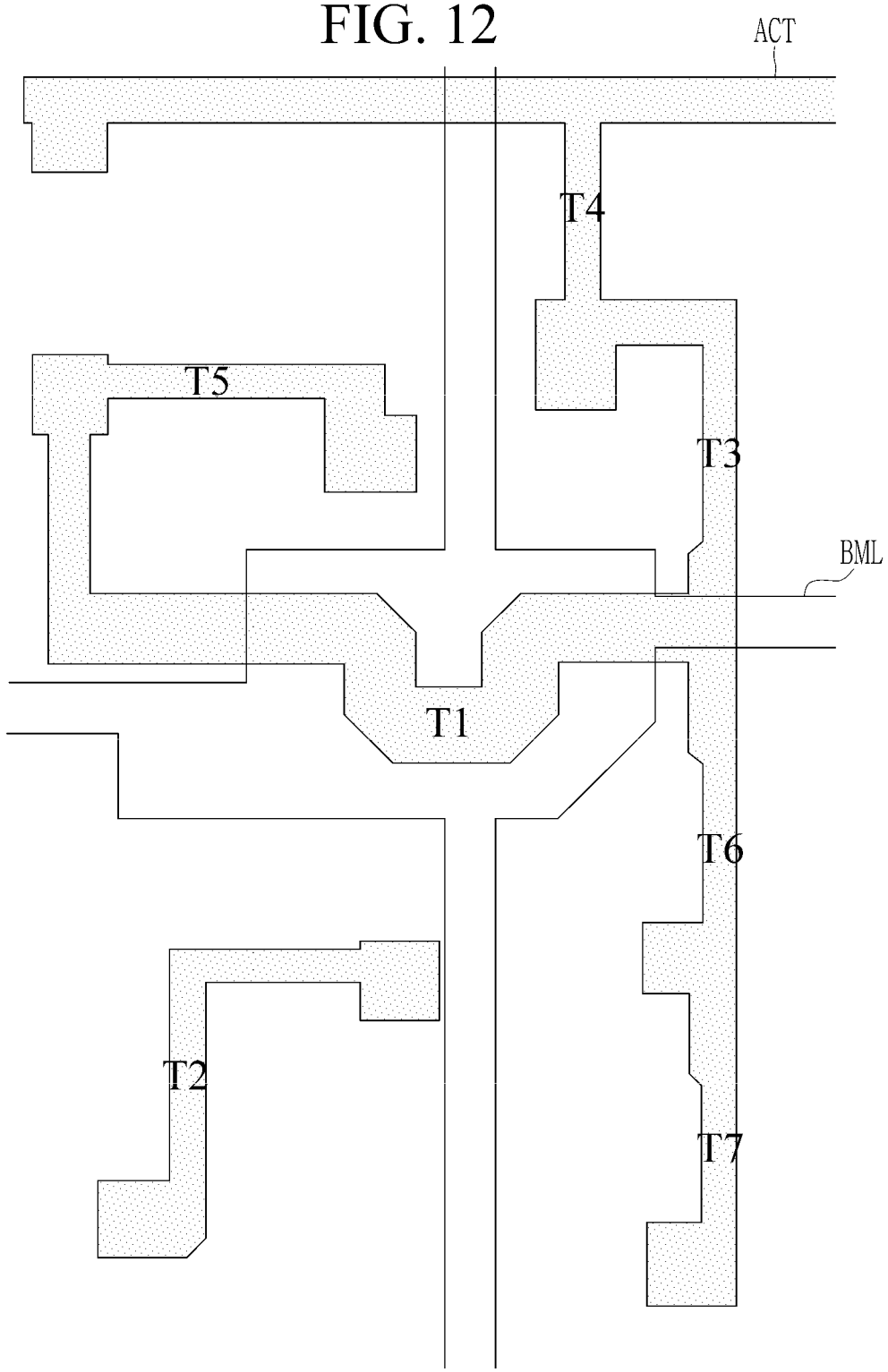
FIG. 12 to FIG. 18 are layout views showing steps for stacking a stacked structure of a pixel according to one or more embodiments of the present disclosure.

Simultaneously referring to FIG. 12 and FIG. 19, a light blocking layer BML is positioned on a substrate SUB. A barrier layer BA is positioned on the light blocking layer BML, and a semiconductor layer ACT is positioned on the barrier layer BA. The region of the semiconductor layer ACT may constitute a driving transistor T1, a second transistor T2, a third transistor T3, a fourth transistor T4, a fifth transistor T5, a sixth transistor T6, and a seventh transistor T7, respectively. The semiconductor layer ACT may include a polycrystalline semiconductor layer.

The light blocking layer BML may be positioned to overlap the driving transistor T1. The light blocking layer BML may block light from entering the driving transistor T1.

Figure 13:
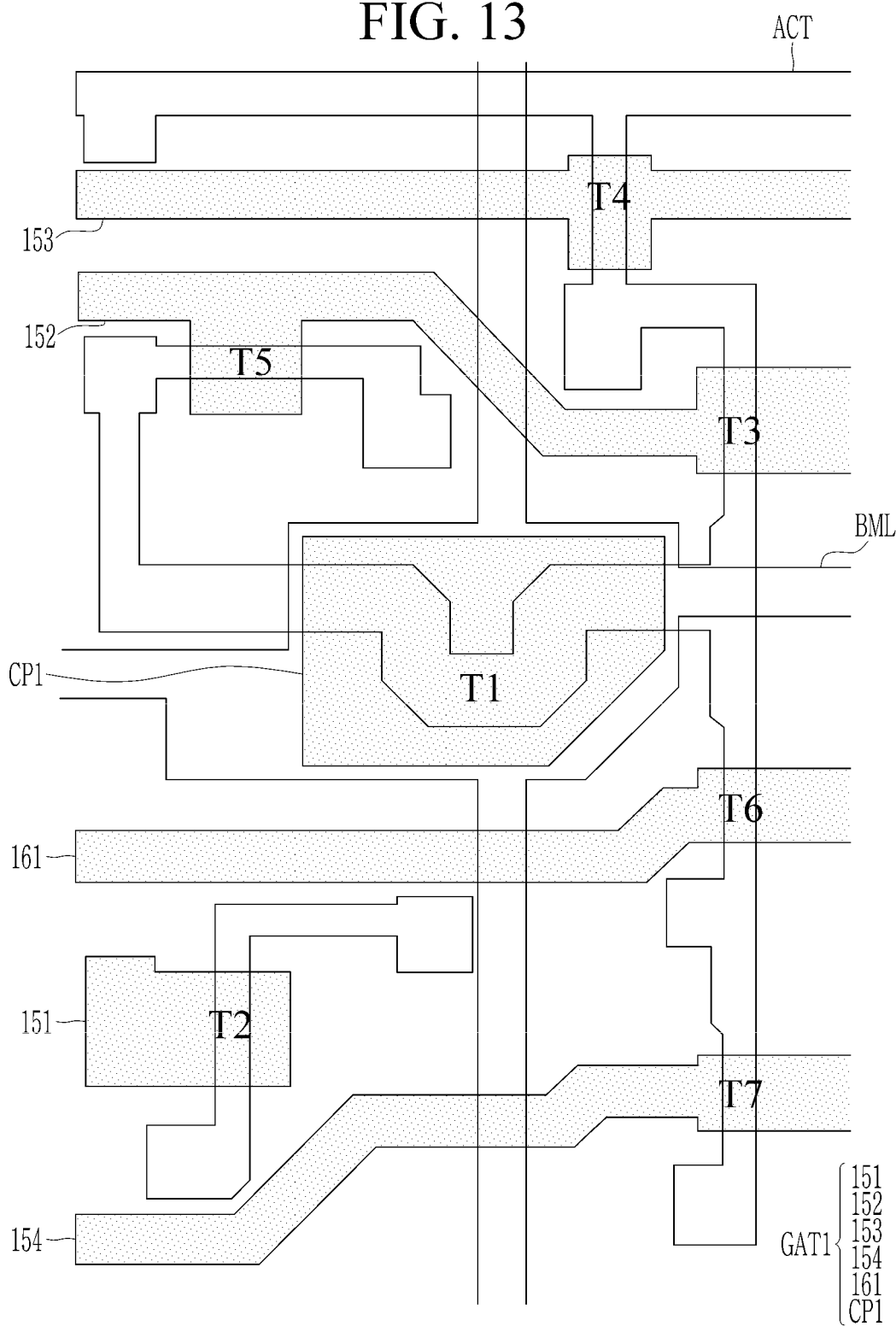

Next, simultaneously referring to FIG. 13 and FIG. 19, a buffer layer BUF and a first gate conductive layer GAT1 are positioned on the semiconductor layer ACT. The buffer layer BUF may include a silicon oxide ($SiO_x$), a silicon nitride ($SiN_x$), a silicon oxynitride ($SiO_xN_y$), and/or amorphous silicon (Si).

The first gate conductive layer GAT1 includes a first scan line 151 receiving a first scan signal GW, a second scan line 152 transmitting a second scan signal GC, a third scan line 153 transmitting a third scan signal GI, a fourth scan line 154 transmitting a fourth scan signal GB, a light emission signal line 161 transmitting a light emission control signal EM, and a first storage pattern CP1 overlapping the driving transistor T1. The first gate conductive layer GAT1 may include molybdenum (Mo), aluminum (Al), copper (Cu), and/or titanium (Ti), and may have a single-layer or multi-layered structure including the same.

Next, as shown in FIG. 13, the semiconductor layer ACT is first doped using the first gate conductive layer GAT1 as a mask. Therefore, the semiconductor layer ACT that does not overlap with the first gate conductive layer GAT1 is doped. The region of the semiconductor layer ACT that is not doped by overlapping with the first gate conductive layer GAT1 becomes a channel. Referring to FIG. 19, the channel C4 of the fourth transistor T4 is positioned to overlap with the first gate conductive layer GAT1, e.g., the third scan line 153.

Figure 14:
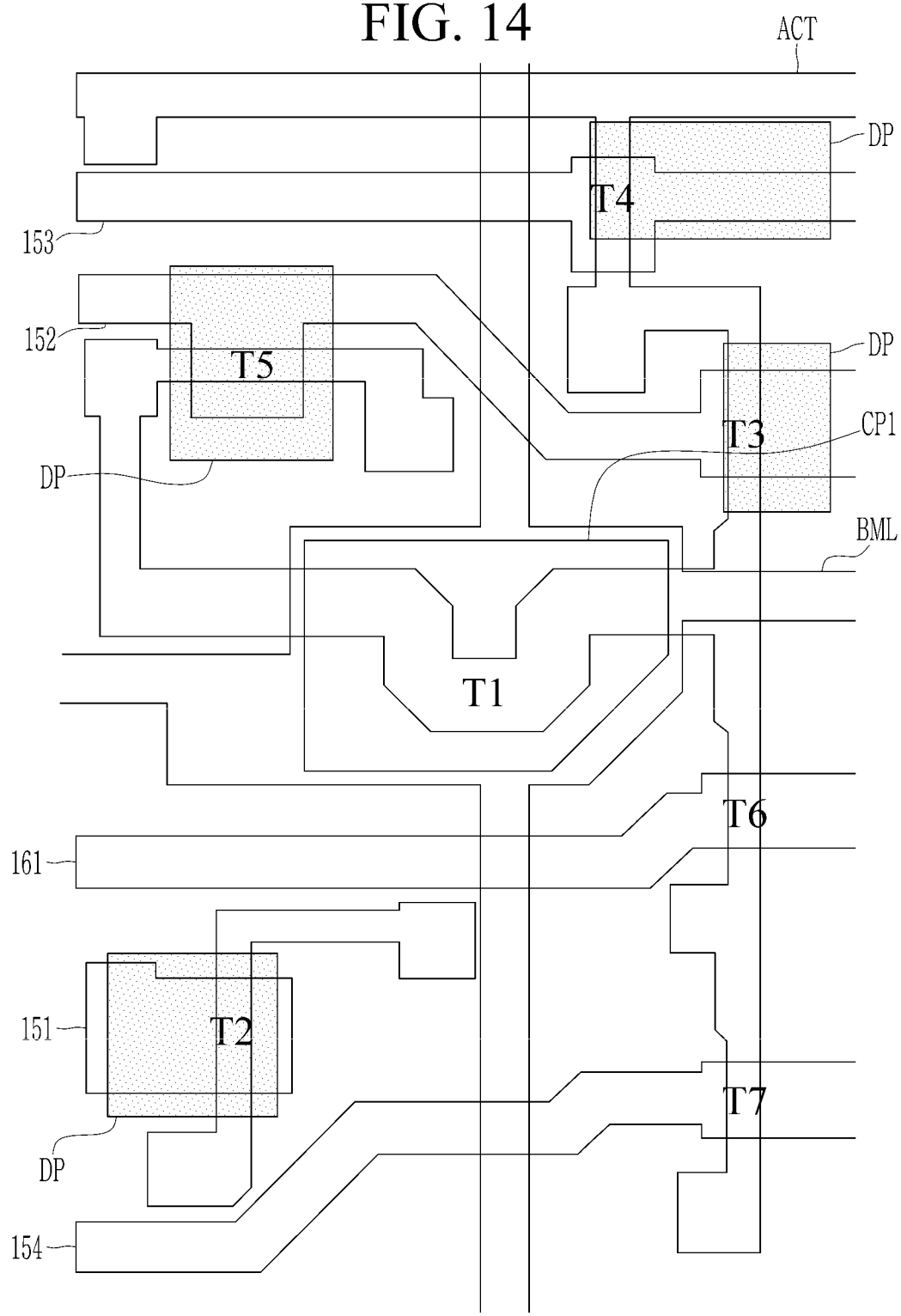

Next, simultaneously referring to FIG. 14 and FIG. 19, a first gate insulating layer GIL1 and a plurality of doping patterns DP are positioned on the first gate conductive layer GAT1. The first gate insulating layer GIL1 may include a silicon oxide (SiOx), a silicon nitride (SiNx), and/or a silicon oxynitride (SiOxNy), and may have a single-layer or multi-layered structure including the same. The doping pattern DP may include molybdenum (Mo), aluminum (Al), copper (Cu), and/or titanium (Ti), and may have a single-layer or multi-layered structure including them.

The doping pattern DP may be positioned to overlap the second transistor T2, the third transistor T3, the fourth transistor T4, and the fifth transistor T5. As shown in FIG. 14, the doping pattern DP overlapping the second transistor T2, the third transistor T3, and the fifth transistor T5 is positioned on both sides of the channel of each transistor, however the doping pattern DP in the case of the fourth transistor T4 is positioned only on one side of the channel. That is, as described above, in the fourth transistor T4, the source electrode/drain electrode is constant regardless of the gray, so the doping pattern DP is positioned only on the side where the drain electrode is positioned.

The semiconductor layer ACT is secondarily doped using the doping pattern DP as a mask. In this process, the semiconductor layer ACT not covered by the doping pattern DP is doped secondarily. In the semiconductor layer ACT overlapping the doping pattern DP, only the primary doping is performed in the previous step, and therefore the doping concentration is lower than that of the semiconductor layer ACT with the secondary doping. The region of the semiconductor layer ACT doped in this way constitutes the low doping region, and the flow of the leakage current can be suppressed by this low doping region.

Referring to FIG. 14, the low doping region of the fourth transistor T4 is positioned only on one side of the channel C4 and not on the other side. Referring to FIG. 19, the low doping region LDA is positioned between the channel C4 and the first electrode D4 of the fourth transistor T4, and the low doping region is not positioned between the channel C4 and the second electrode S4. The low doping region LDA overlaps the doping pattern DP.

As shown in FIG. 14, the size of the doping pattern DP overlapping with the fourth transistor T4 is also smaller than the size of the doping pattern DP overlapping other transistors, compared with the one or more embodiments in which the low doping region is positioned on both sides, so the design freedom may be increased and the pixel size may be formed smaller.

Figure 15:
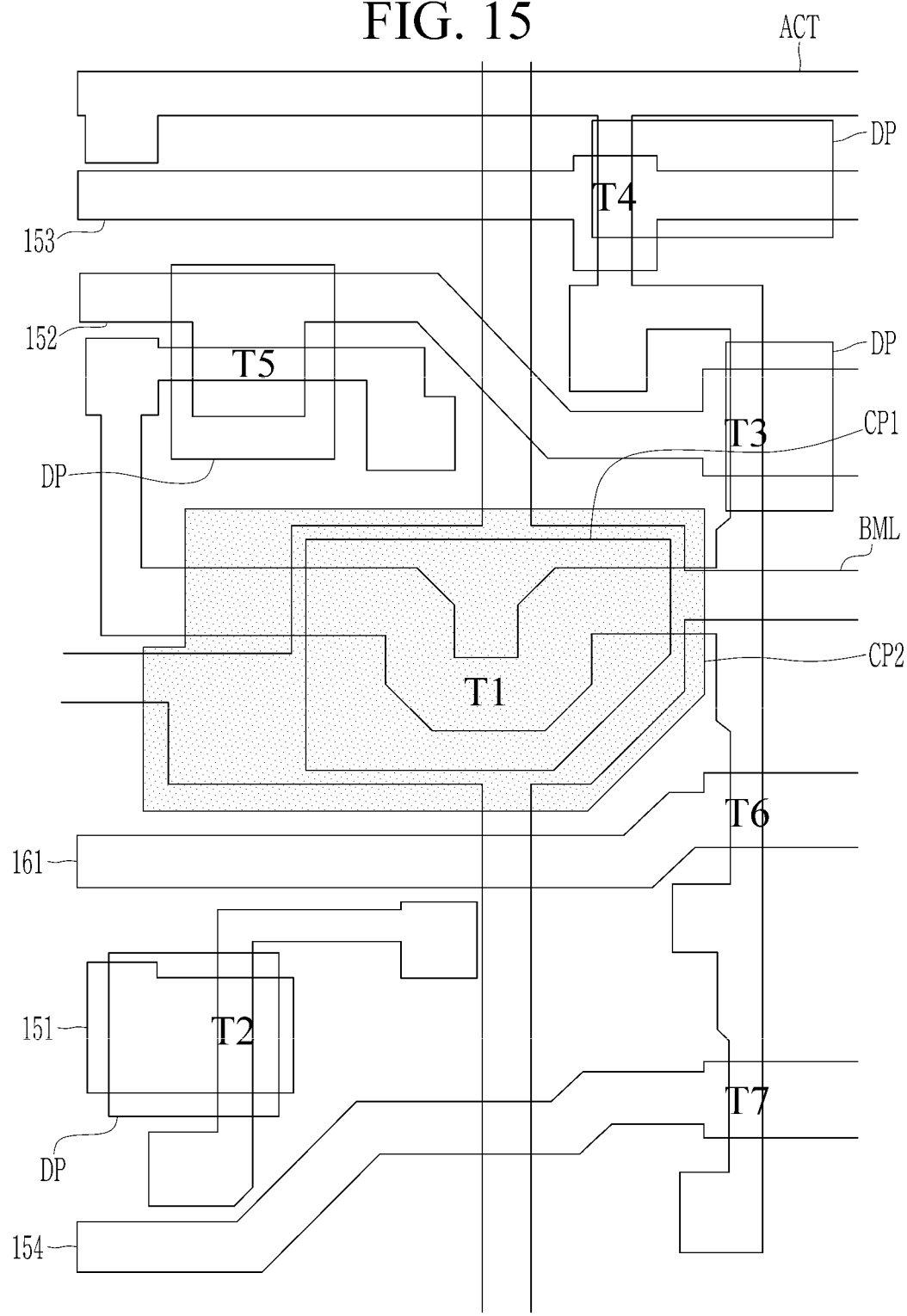

Next, simultaneously referring to FIG. 15 and FIG. 19, a second gate insulating layer GIL2 and a second gate conductive layer GAT2 are positioned on the doping pattern DP. The second gate insulating layer GIL2 may include a silicon oxide (SiOx), a silicon nitride (SiNx), and/or a silicon oxynitride (SiOxNy), and may have a single-layer or multi-layered structure including the same. The second gate conductive layer GAT2 may include molybdenum (Mo), aluminum (Al), copper (Cu), silver (Ag), chromium (Cr), tantalum (Ta), titanium (Ti), and/or other suitable materials, and may be a single-layer or multi-layered structure.

The second gate conductive layer GAT2 may include a second storage pattern CP2 overlapping the first storage pattern CP1. The second storage pattern CP2 may constitute the storage capacitor Cst together with the first storage pattern CP1.

Figure 16:
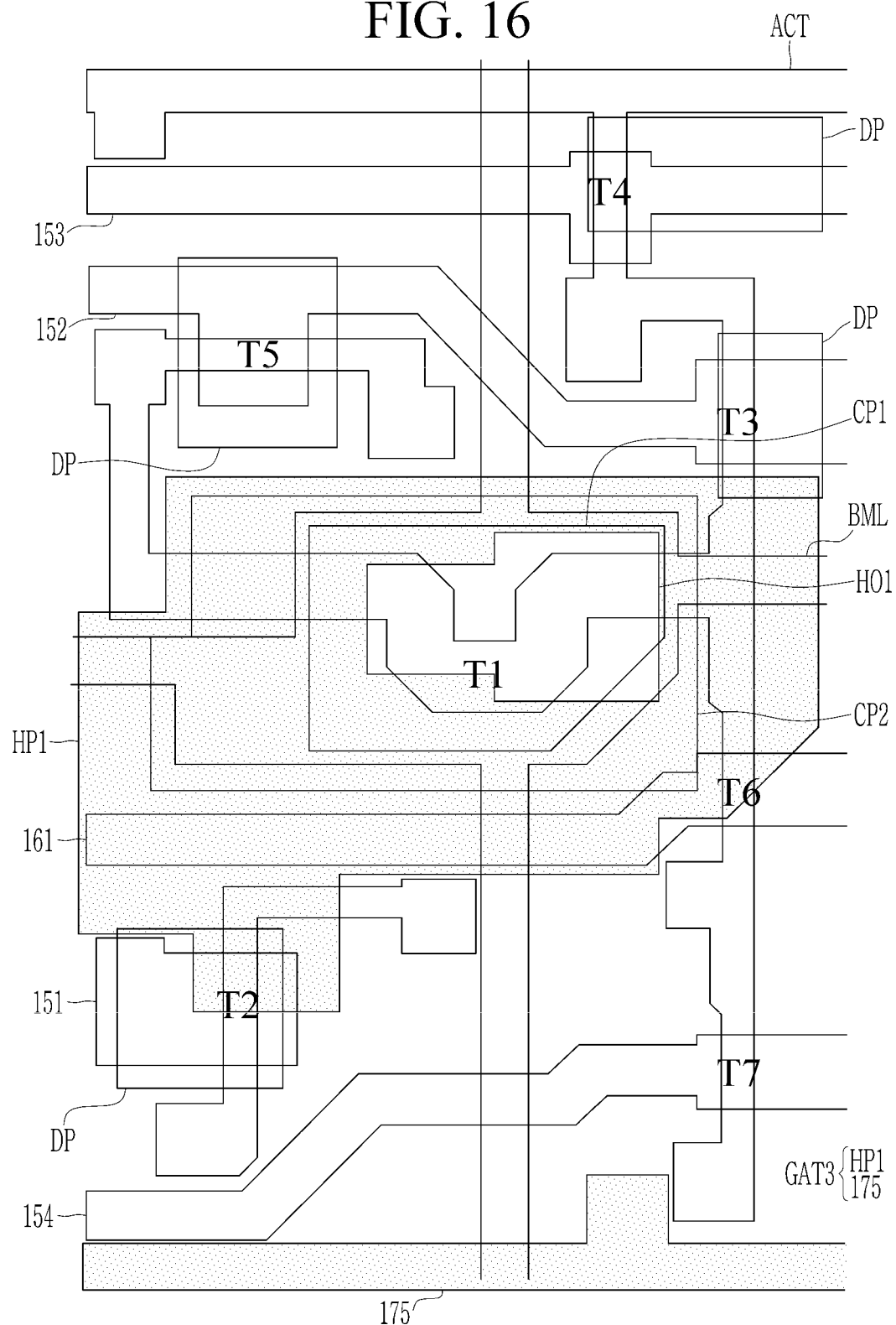

Next, simultaneously referring to FIG. 16 and FIG. 19, a third gate insulating layer GIL3 and a third gate conductive layer GAT3 are positioned on the second gate conductive layer GAT2. The third gate insulating layer GIL3 may include a silicon oxide (SiOx), a silicon nitride (SiNx), and/or a silicon oxynitride (SiOxNy), and may have a single-layer or multi-layered structure including the same. The third gate conductive layer GAT3 may include molybdenum (Mo), aluminum (Al), copper (Cu), and/or titanium (Ti), and may have a single-layer or multi-layered structure including the same.

The third gate conductive layer GAT3 includes a second initialization voltage line 175 that transmits the second initialization voltage AVint and a first hold pattern HP1 constituting one electrode of the hold capacitor. The first hold pattern HP1 may include a first hold opening HO1 positioned inside the first hold pattern HP1.

The first hold pattern HP1 may form the hold capacitor Chold together with the second storage pattern CP2.

Figure 17:
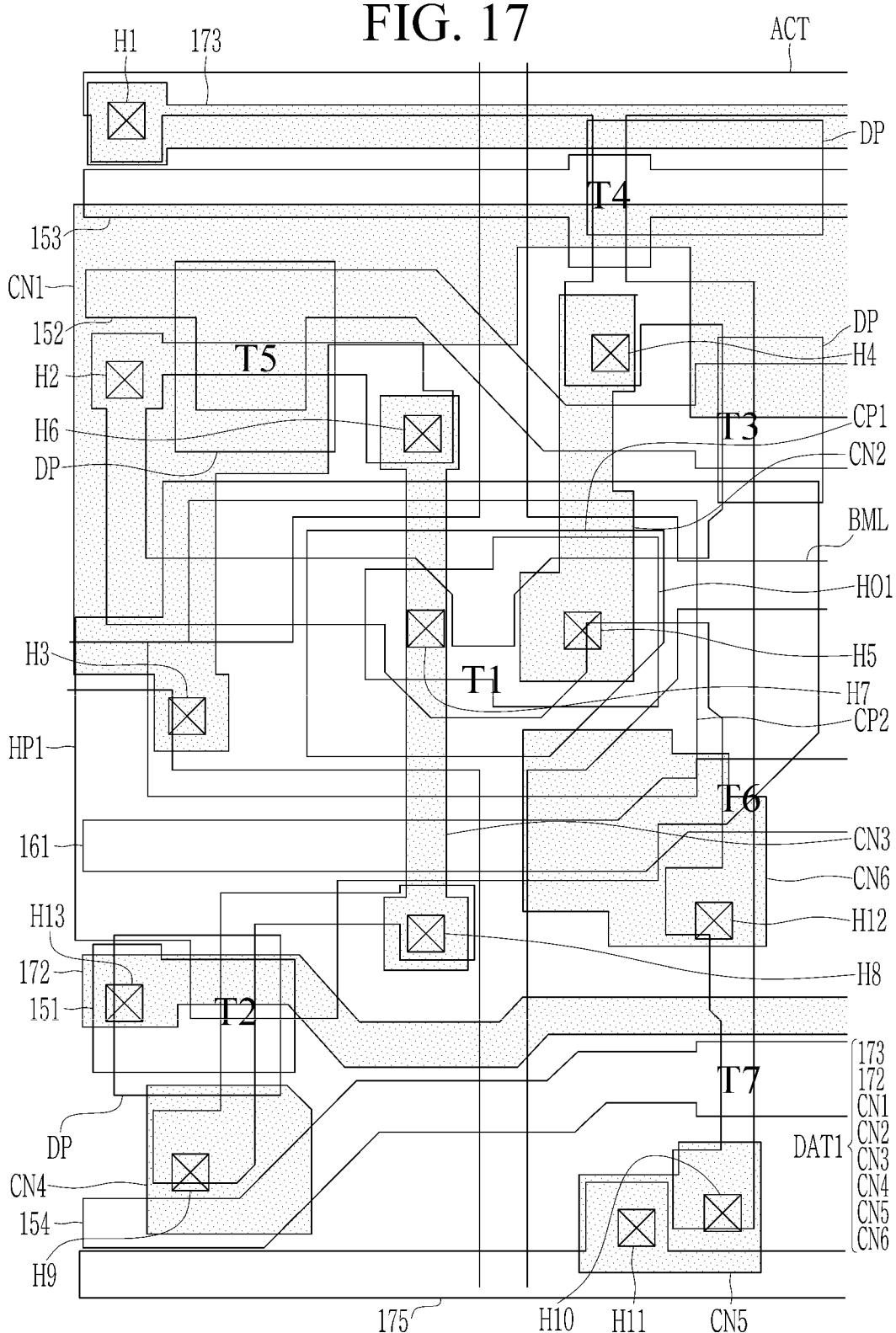

Next, simultaneously referring to FIG. 17 and FIG. 19, a first interlayer insulating layer ILD1 and a first data conductive layer DAT1 are positioned on the third gate conductive layer GAT3. The first interlayer insulating layer ILD1 may include a silicon oxide (SiOx), a silicon nitride (SiNx), and/or a silicon oxynitride (SiOxNy), and may have a single-layer or multi-layered structure including the same. The first data conductive layer DAT1 may include aluminum (Al), platinum (Pt), palladium (Pd), silver (Ag), magnesium (Mg), gold (Au), nickel (Ni), neodymium (Nd), and/or iridium (Ir), and may include chromium (Cr), nickel (Ni), calcium (Ca), molybdenum (Mo), titanium (Ti), tungsten (W), and/or copper (Cu), and may be a single layer or a multi-layered structure including the same.

The first data conductive layer DAT1 includes a first initialization voltage line 173 transmitting the first initialization voltage Vint, a first scan signal line 172 transmitting the first scan signal GW, a first connection pattern CN1, a second connection pattern CN2, a third connection pattern CN3, a fourth connection pattern CN4, a fifth connection pattern CN5, and a sixth connection pattern CN6.

The first initialization voltage line 173 is connected to the semiconductor layer ACT through the first contact hole H1 to transmit the initialization voltage Vint to the fourth transistor T4.

The first connection pattern CN1 is connected to one electrode of the fifth transistor T5 through the second contact hole H2. In addition, the first connection pattern CN1 is connected to the first hold pattern HP1 of the third gate conductive layer GAT3 through the third contact hole H3.

The second connection pattern CN2 is connected to the semiconductor layer ACT through the fourth contact hole H4. In addition, the second connection pattern CN2 is connected to the second storage pattern CP2 through the fifth contact hole H5. That is, the second connection pattern CN2 connects the third transistor T3 and the storage capacitor Cst to each other.

The third connection pattern CN3 is connected to the semiconductor layer ACT of the fifth transistor T5 through the sixth contact hole H6, and is connected to the second storage pattern CP2 through the seventh contact hole H7. Also, it is connected to the semiconductor layer ACT of the second transistor T2 through the eighth contact hole H8. That is, the third connection pattern CN3 connects the fifth transistor T5, the second transistor T2, and the storage capacitor Cst.

Next, the fourth connection pattern CN4 is connected to the semiconductor layer of the second transistor T2 through the ninth contact hole H9.

In addition, the fifth connection pattern CN5 is connected to the semiconductor layer of the seventh transistor T7 through the tenth contact hole H10 and is connected to the second initialization voltage line 175 through the eleventh contact hole H11. Therefore, the fifth connection pattern CN5 transmits the second initialization voltage of the second initialization voltage line 175 to the seventh transistor T7.

The sixth connection pattern CN6 is connected to the semiconductor layer of the sixth transistor T6 through the twelfth contact hole H12.

The first scan signal line 172 is connected to the first scan pattern 151 of the first gate conductive layer through the thirteenth contact hole H13. Therefore, the first scan signal GW is transmitted to the gate electrode of the second transistor T2.

Figure 18:
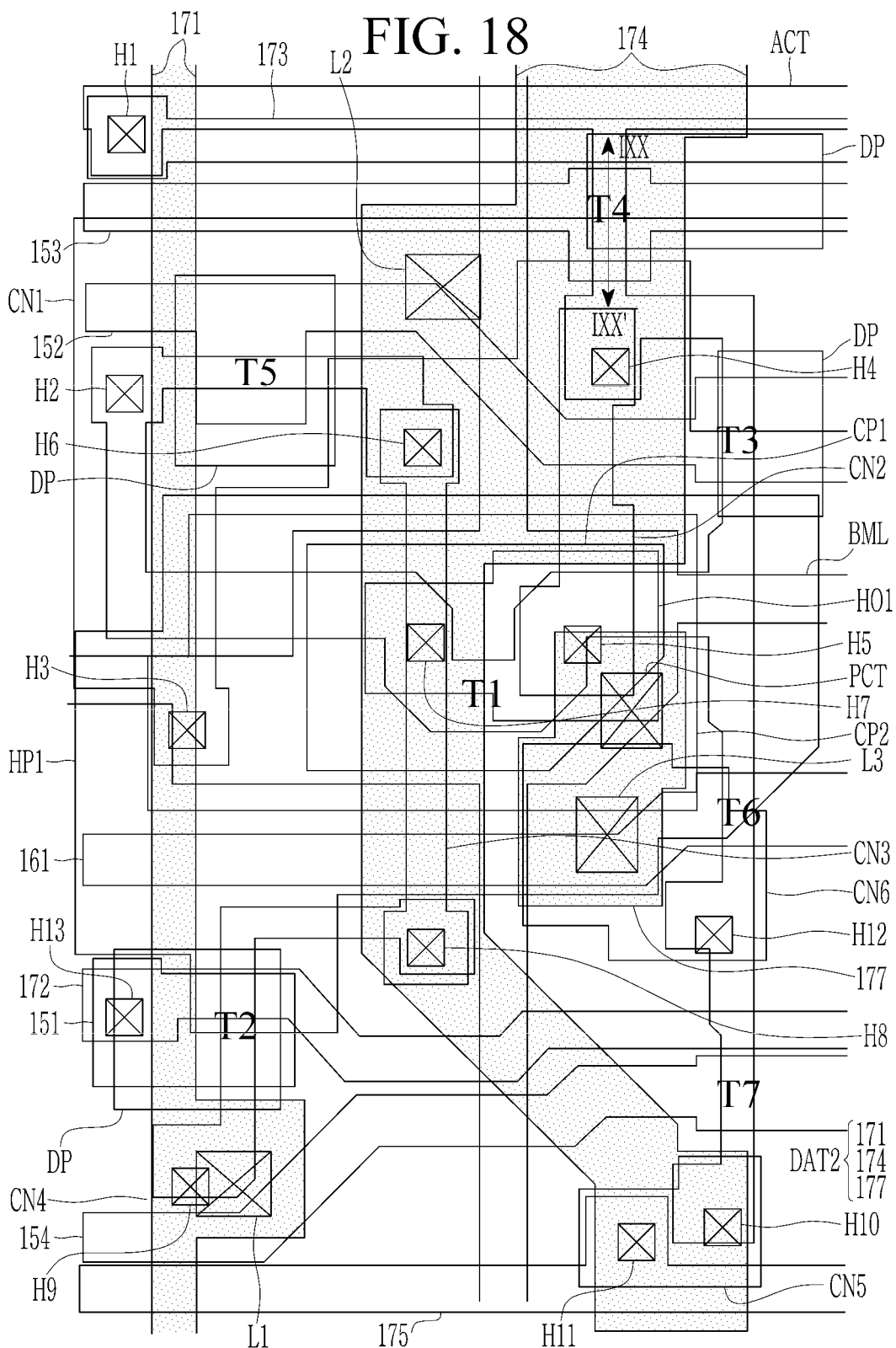
Figure 19:
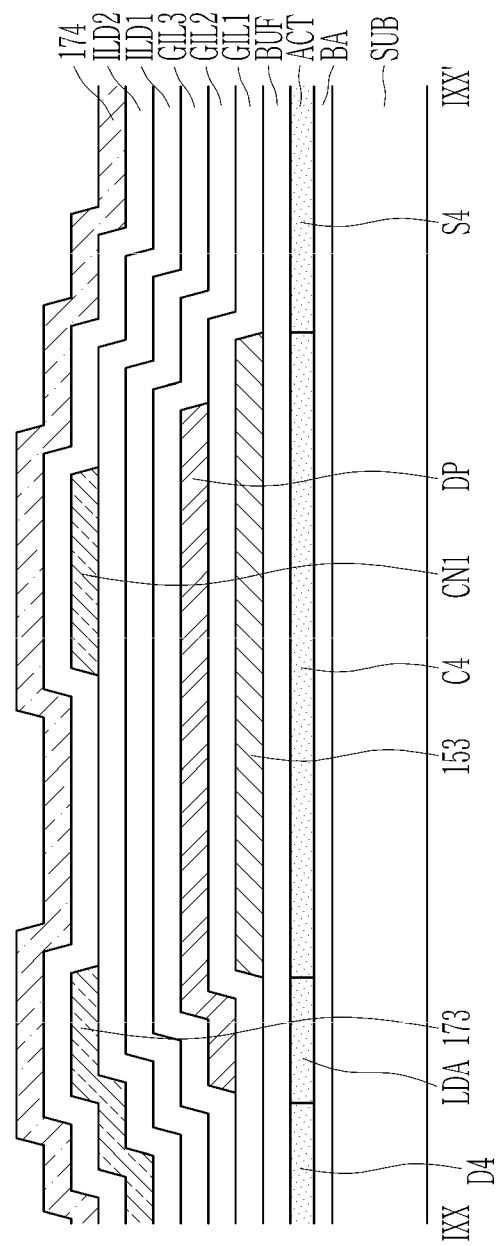
FIG. 19 is a cross-sectional view taken along the line IXX-IXX' of FIG. 18, according to one or more embodiments of the present disclosure.

Next, simultaneously referring to FIG. 18 and FIG. 19, a second interlayer insulating layer ILD2 and a second data conductive layer DAT2 are positioned on the first data conductive layer DAT1. The second interlayer insulating layer ILD2 may include a silicon oxide (SiOx), a silicon nitride (SiNx), and/or a silicon oxynitride (SiOxNy), and may have a single-layer or multi-layered structure including the same. The second data conductive layer DAT2 may include aluminum (Al), platinum (Pt), palladium (Pd), silver (Ag), magnesium (Mg), gold (Au), nickel (Ni), neodymium (Nd), and/or iridium (Ir), and may include (Cr) chromium, nickel (Ni), calcium (Ca), molybdenum (Mo), titanium (Ti), tungsten (W), and/or copper (Cu), and may be a single-layer or a multi-layered structure including the same.

The second data conductive layer DAT2 may include the data line 171 and the driving voltage line 174, and a data connection pattern 177.

The data line 171 is connected to the fourth connection pattern CN4 through the twenty-first contact hole L1. Because the fourth connection pattern CN4 is connected to the second transistor T2, the data voltage DATA of the data line 171 is transferred to the second transistor T2.

The driving voltage line 174 is connected to the first connection pattern CN1 through the twenty-second contact hole L2. The first connection pattern CN1 is connected to one electrode of the fifth transistor T5 through the second contact hole H2, and the driving voltage ELVDD is transferred to the fifth transistor T5.

In addition, the first connection pattern CN1 is connected to the first hold pattern HP1 of the third gate conductive layer GAT3 through the third contact hole H3, and then the driving voltage ELVDD is transferred to one electrode of the hold capacitor Chold.

The data connection pattern 177 is connected to the sixth connection pattern CN6 through the twenty-third contact hole L3. The sixth connection pattern CN6 is connected to the semiconductor layer of the sixth transistor T6 through the twelfth contact hole H12.

An insulating layer may be positioned on the second data conductive layer DAT2. The insulating layer may include an organic insulating material such as a generally-used polymer such as poly(methyl methacrylate) (PMMA) and/or polystyrene (PS), and/or a polymer derivative having a phenol-based group, an acryl-based polymer, an imide-based polymer, a polyimide, an acryl-based polymer, and/or a siloxane-based polymer.

The insulating layer may include a pixel contact hole PCT. A light emitting diode (LED) may be positioned on the insulating layer. The data connection pattern 177 may be connected to the light emitting diode LED through the pixel contact hole PCT. The data connection pattern 177 connects the sixth transistor T6 and the light emitting diode LED, and accordingly, the sixth transistor T6 may transmit the output current of the driving transistor T1 to the light emitting diode LED based on the light emission control signal EM.

While this disclosure has been described in connection with what is presently considered to be practical embodiments, it is to be understood that the present disclosure is not limited to the illustrated embodiments. On the contrary, it is intended to cover various modifications and equivalent arrangements included within the spirit and scope of the appended claims and their equivalents.

| Description of symbols | |
| --- | --- |
| T1: driving transistor | T4: fourth transistor |
| DP: doping pattern | ACT: semiconductor layer |
| GAT1: first gate conductive layer | GAT2: second gate conductive layer |
| GAT3: third gate conductive layer | DAT1: first data conductive layer |
| DAT2: second data conductive layer | LDA: low doping region |

What is claimed is:

1. A display device comprising:
a substrate; and
a semiconductor layer comprising a driving transistor and a fourth transistor on the substrate,
a first electrode of the driving transistor connected to a driving voltage line to receive a driving voltage,
a first electrode of the fourth transistor connected to a first initialization voltage line to receive a first initialization voltage,
a second electrode of the fourth transistor is connected to a gate electrode of the driving transistor,
a low doping region between a channel of the fourth transistor and the first electrode of the fourth transistor, and
wherein a low doping region is not between the channel of the fourth transistor and the second electrode of the fourth transistor.

2. The display device of claim 1, wherein the semiconductor layer further comprises a second transistor, and a first electrode of the second transistor is connected to a data line to receive a data voltage, a second electrode of the second transistor is connected to the gate electrode of the driving transistor, a low doping region is between a channel of the second transistor and the first electrode of the second transistor, and a low doping region is between the channel of the second transistor and the second electrode of the second transistor.

3. The display device of claim 1, wherein the semiconductor layer further comprises a third transistor, and a first electrode of the third transistor is connected to a second electrode of the driving transistor, a second electrode of the third transistor is connected to the gate electrode of the driving transistor, a low doping region is between a channel of the third transistor and the first electrode of the third transistor, and a low doping region is between the channel of the third transistor and the second electrode of the third transistor.

4. The display device of claim 1, wherein the semiconductor layer further comprises a fifth transistor, and a first electrode of the fifth transistor is connected to the driving voltage line to receive the driving voltage, a second electrode of the fifth transistor is connected to the gate electrode of the driving transistor, a low doping region is between a channel of the fifth transistor and the first electrode of the fifth transistor, and a low doping region is between the channel of the fifth transistor and the second electrode of the fifth transistor.

5. The display device of claim 1, wherein the semiconductor layer further comprises a sixth transistor, and a first electrode of the sixth transistor is connected to a second electrode of the driving transistor, and a second electrode of the sixth transistor is connected to a light emitting diode.

6. The display device of claim 1, wherein the semiconductor layer further comprises a seventh transistor, and a first electrode of the seventh transistor is connected to a second initialization voltage line to receive a second initialization voltage, and a second electrode of the seventh transistor is connected to a light emitting diode.

7. The display device of claim 1, further comprising a plurality of doping patterns on the semiconductor layer, wherein the plurality of doping patterns overlap the low doping region in a direction perpendicular to the substrate.

8. The display device of claim 4, further comprising a hold capacitor between the second electrode of the fifth transistor and the driving voltage line.

9. The display device of claim 2, further comprising a storage capacitor between the second electrode of the second transistor and the gate electrode of the driving transistor.

10. A display device comprising:
a substrate;
a semiconductor layer on the substrate and comprising a driving transistor, a second transistor, a third transistor, a fourth transistor, a fifth transistor, a sixth transistor, and a seventh transistor;
a gate conductive layer on the semiconductor layer; and
a plurality of doping patterns on the gate conductive layer,
wherein the plurality of doping patterns overlap the second transistor, the third transistor, the fourth transistor, and the fifth transistor, respectively, and
wherein, in a direction perpendicular to the substrate, a doping pattern of the plurality of doping patterns overlaps the fourth transistor and one edge of the doping pattern overlaps the gate conductive layer and fourth transistor.

11. The display device of claim 10, wherein a channel of the fourth transistor overlaps the gate conductive layer, a first side region adjacent to the channel overlaps the doping pattern, and a second side region adjacent to the channel does not overlap the doping pattern.

12. The display device of claim 11, wherein a doping concentration of the first side region overlapping the doping pattern is lower than a doping concentration of the second side region that does not overlap the doping pattern.

13. The display device of claim 10, wherein the fourth transistor comprises a channel, a first electrode on one side of the channel and a second electrode on another side of the channel, and a low doping region between the first electrode and the channel, and wherein the low doping region has a doping concentration that is lower than that of the first electrode and the second electrode.

14. The display device of claim 13, wherein the low doping region overlaps the doping pattern.

15. The display device of claim 14, wherein a first electrode of the driving transistor is connected to a driving voltage line to receive a driving voltage, the first electrode of the fourth transistor is connected to a first initialization voltage line to receive a first initialization voltage, and the second electrode of the fourth transistor is connected to a gate electrode of the driving transistor.

16. The display device of claim 10, wherein a channel of the second transistor overlaps the gate conductive layer, and both regions of the second transistor adjacent to the channel of the second transistor overlap the plurality of doping patterns.

17. The display device of claim 10, wherein a channel of the third transistor overlaps the gate conductive layer, and both regions of the third transistor adjacent to the channel of the third transistor overlap the plurality of doping patterns.

18. The display device of claim 10, wherein a channel of the fifth transistor overlaps the gate conductive layer, and both regions of the fifth transistor adjacent to the channel of the fifth transistor overlap the plurality of doping patterns.

19. The display device of claim 10, wherein the second transistor, the third transistor, and the fifth transistor each respectively comprise:

a channel overlapping the gate conductive layer;
a first electrode on one side of the channel and a second electrode on another side of the channel; and
a low doping region between the channel and the first electrode, and between the channel and the second electrode.

20. The display device of claim 19, wherein the low doping region of at least one of the second transistor, the third transistor or the fifth transistor overlaps the plurality of doping patterns.

* * * * *